(12) United States Patent
Nakajima

(10) Patent No.: US 6,791,309 B2
(45) Date of Patent: Sep. 14, 2004

(54) LIMITER CIRCUIT

(75) Inventor: Kenichi Nakajima, Hanyu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/393,569

(22) Filed: Mar. 21, 2003

(65) Prior Publication Data

US 2003/0184273 A1 Oct. 2, 2003

(30) Foreign Application Priority Data

Mar. 27, 2002 (JP) .................................. 2002-088326

(51) Int. Cl.$^7$ .............................. G05F 3/16; H03F 3/45
(52) U.S. Cl. ..................................... 323/316; 330/253
(58) Field of Search ................................. 323/312, 313, 323/314, 315, 316; 330/253, 256, 260, 261

(56) References Cited

U.S. PATENT DOCUMENTS

| | | | | |
|---|---|---|---|---|
| 5,512,858 A | * | 4/1996 | Perrot | 330/256 |
| 6,317,001 B1 | * | 11/2001 | Roth | 330/289 |
| 6,356,152 B1 | * | 3/2002 | Jezdic et al. | 330/253 |

* cited by examiner

Primary Examiner—Jessica Han
(74) Attorney, Agent, or Firm—Fish & Richardson P.C.

(57) ABSTRACT

A limiter circuit according to this invention includes a first differential amplifier, a first transistor to a base of which the output of the first differential amplifier is applied, a first feedback path, a first current source connected to the emitter of the first transistor, a second differential amplifier, a second transistor to a base of which the output of the second differential amplifier is applied, a second feedback path, a second current source connected to the emitter of the second transistor and a resistance connected between the emitter of the first transistor and the emitter of the second transistor.

8 Claims, 4 Drawing Sheets

LIMITER CIRCUIT

BACKGROUND OF THE INVENTION

1. Field of the Invention

This invention relates to a limiter circuit which clamps an input signal to within certain limits, specifically to a limiter circuit suitable for a TV receiver to generate a sawtooth wave used for vertical deflection.

2. Description of the Related Art

A TV receiver of conventional art generates the sawtooth wave based on a vertical synchronizing signal, amplifies it, shapes the waveform and provides a vertical deflecting coil with the sawtooth wave current. The amount of vertical deflection can be modified by the amplitude of the sawtooth wave. Recent TV receivers have a zoom mode in which a display screen is zoomed in.

FIG. 2A and FIG. 2B are to explain the zoom mode of the TV receiver. A picture on the TV screen is represented by a circle in FIG. 2A. The circle in FIG. 2A is enlarged in the zoom mode as shown in FIG. 2B. Increased amount of vertical and horizontal deflection is required in the zoom mode.

FIG. 3 shows the change in the vertical sawtooth wave associated with the zoom mode. The sawtooth wave in conventional mode is indicated by solid lines. And the sawtooth wave in zoom mode is indicated by dashed lines. The zoom mode is enabled by using the sawtooth wave indicated by the dashed lines. The amplitude of the sawtooth wave needs to be adjusted to the required enlargement. A limiter circuit clamps the amplitude of the sawtooth wave in FIG. 3 to provide the adjustment.

FIG. 4 shows a limiter circuit according to a conventional art. The sawtooth wave shown in FIG. 3 is generated in a signal source 1 in FIG. 4. The sawtooth wave is led to an output terminal 3 through a resistance 2. A transistor 4 and a reference voltage source 5 for upper amplitude limiting and a transistor 6 and a reference voltage source 7 for lower voltage amplitude limiting are connected to the output terminal 3.

The reference voltage source 5 is set at a certain voltage so that the emitter voltage of the transistor 4 becomes a level indicated by a chain line B in FIG. 3. The reference voltage source 7 is set at a certain voltage so that the emitter voltage of the transistor 6 becomes a level indicated by a chain line C in FIG. 3. Herewith the sawtooth wave indicated by the dashed lines in FIG. 3 varies between the level indicated by the chain line B and the level indicated by the chain line C.

When the sawtooth wave without limited amplitude is used, the vertical deflection angle of an electron beam is extended to cause scattering of the electron beam at the upper edge and the lower edge, resulting in abnormal brightening on the screen. Thus the amplitude of the sawtooth wave is limited to prevent the abnormal brightening on the screen.

Also, there is a problem that the display becomes distorted at the upper end and the lower end of the TV screen, due to the limiter circuit. This problem will be explained referring to FIG. 5. While horizontal lines in FIG. 5 should be displayed as equidistant parallel lines, the distances between the horizontal lines near the upper edge and the lower edge of the TV screen are narrowed. The cause is attributed to the clamping operation of the limiter circuit shown in FIG. 4.

FIG. 6 shows an enlargement of a portion A in FIG. 3. The amplitude of the sawtooth wave shown by dashed line in FIG. 6 is supposed to be limited at the level shown by chain line B. The sawtooth wave is supposed to keep a form of straight line indicated by the dashed line in FIG. 6 until its amplitude is limited. In reality, however, the amplitude of the sawtooth wave is limited taking a form of curve indicated by a solid curving line in FIG. 6. This is caused by conductance in rising operation of the transistor 4 and the transistor 6 in the limiter circuit shown in FIG. 4. Thus a limiter circuit which can clamp the amplitude of the sawtooth wave keeping its waveform straight as indicated by the dashed line in FIG. 6 is needed.

SUMMARY OF THE INVENTION

This invention is made considering the problems addressed above. A circuit according to this invention includes a first differential amplifier to an input terminal of which an input signal is applied, a first transistor to a base of which the output of the first differential amplifier is applied, a first feedback path connected between an emitter of the first transistor and the other input terminal of the first differential amplifier, a first current source connected to the emitter of the first transistor, a second differential amplifier to an input terminal of which a bias voltage is applied, a second transistor to a base of which the output of the second differential amplifier is applied, a second feedback path connected between an emitter of the second transistor and the other input terminal of the second differential amplifier, a second current source connected to the emitter of the second transistor and a resistance connected between the emitter of the first transistor and the emitter of the second transistor, and provides output signals from collectors of the first and the second transistors.

Or a circuit according to this invention includes a first differential amplifier to an input terminal of which an input signal is applied, a first transistor to a base of which the output of the first differential amplifier is applied, a first feedback path connected between an emitter of the first transistor and the other input terminal of the first differential amplifier, a first current source connected to the emitter of the first transistor, a second differential amplifier to an input terminal of which a bias voltage is applied, a second transistor to a base of which the output of the second differential amplifier is applied, a second feedback path connected between an emitter of the second transistor and the other input terminal of the second differential amplifier, a second current source connected to the emitter of the second transistor and a resistance connected between the emitter of the first transistor and the emitter of the second transistor, and provides an output signal from a collector of the first transistor or from a collector of the second transistor.

Furthermore, a circuit according to this invention includes a sawtooth wave generation circuit, a first differential amplifier to an input terminal of which an output signal of the sawtooth wave generation circuit is applied, a first transistor to a base of which the output of the first differential amplifier is applied, a first feedback path connected between an emitter of the first transistor and the other input terminal of the first differential amplifier, a first current path connected to the emitter of the first transistor and through which a constant current flows, a second differential amplifier to an input terminal of which a bias voltage is applied, a second transistor to a base of which the output of the second differential amplifier is applied, a second feedback path connected between an emitter of the second transistor and the other input terminal of the second differential amplifier, a second current path connected to the emitter of the second transistor and through which a constant current flows and a resistance connected between the emitter of the first transistor and the emitter of the second transistor, and provides output signals from an output signal from collectors of the first and the second transistors or from either of the collectors of the first and the second transistors.

DETAILED DESCRIPTION OF THE INVENTION

Figure 1:
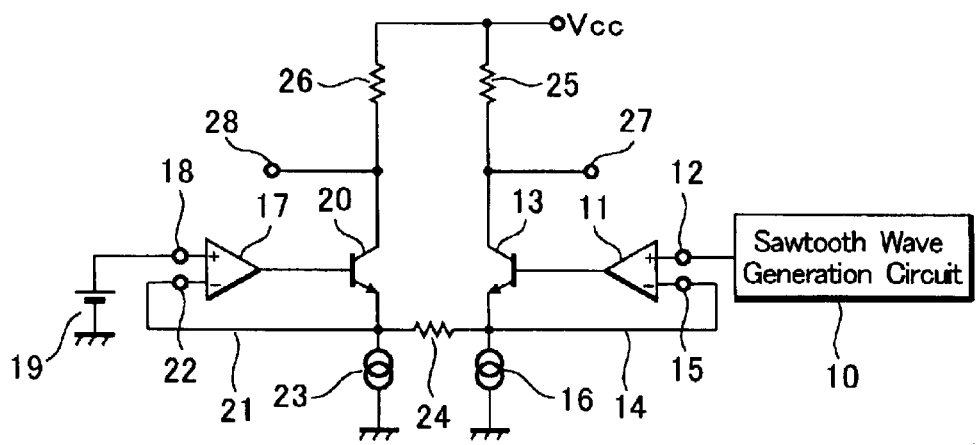
FIG. 1 is a block diagram showing a limiter circuit and a sawtooth wave generation circuit equipped with it according to an embodiment of this invention.
Figure 2A:
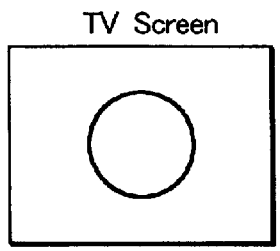
FIG. 2A and FIG. 2B show TV screens used to explain a zoom mode.
Figure 2B:
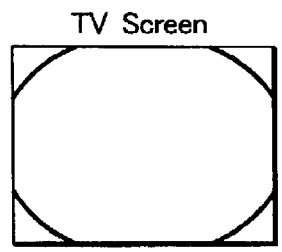
Figure 3:
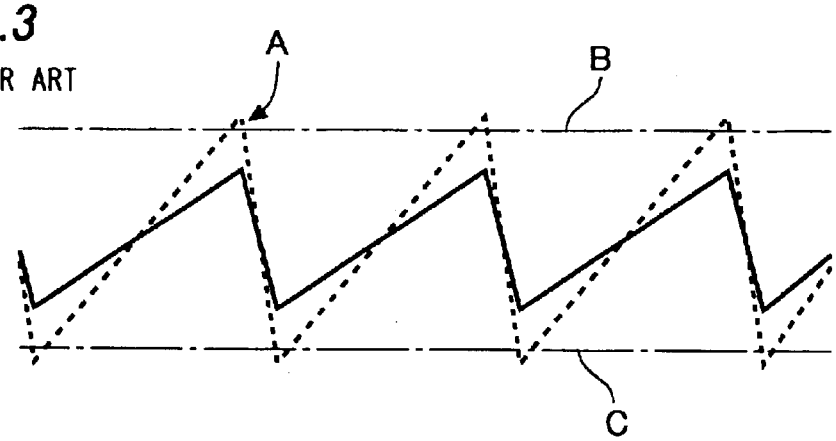
FIG. 3 is a waveform diagram showing a sawtooth wave according to a conventional art.
Figure 4:
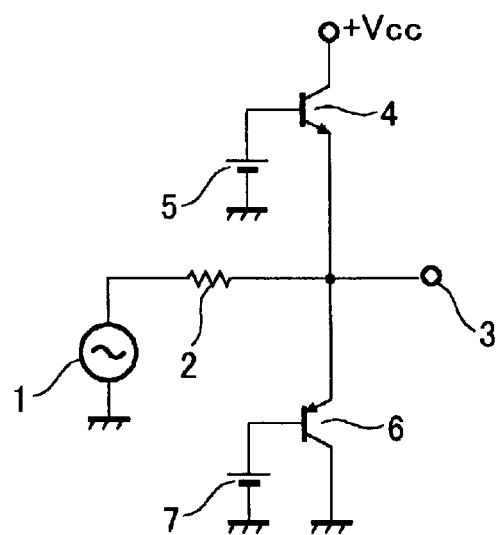
FIG. 4 shows a limiter circuit according to the conventional art.
Figure 5:
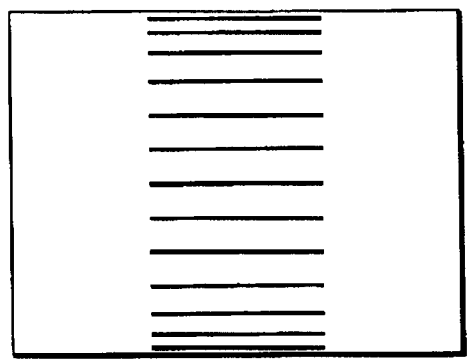
FIG. 5 shows a TV screen used to explain an abnormal display seen in the zoom mode.
Figure 6:
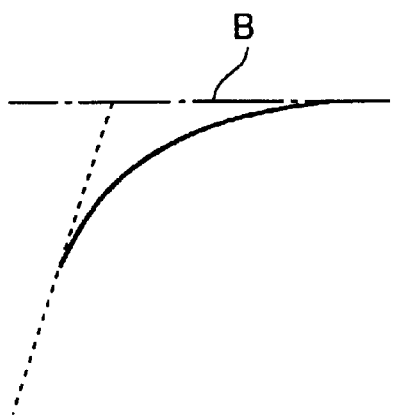
FIG. 6 is a waveform diagram used to explain an operation of the limiter circuit according to the conventional art.

Next, an embodiment of this invention will be explained referring to FIG. 1. A sawtooth wave generation circuit 10 is shown in FIG. 1. A sawtooth wave input signal from the sawtooth wave signal generation circuit 10 is applied to an input terminal 12 of a first differential amplifier 11.

An output signal of the first differential amplifier 11 is applied to a base of a first transistor 13. A first feedback path 14 connects an emitter of the first transistor 13 and the other input terminal 15 of the first differential amplifier 11.

A first current source 16 is connected to the emitter of the first transistor 13. A bias voltage from a bias source 19 is applied to an input terminal 18 of a second differential amplifier 17. An output signal of the second differential amplifier 17 is applied to a base of a second transistor 20. A second feedback path 21 connects an emitter of the second transistor 20 and the other input terminal 22 of the second differential amplifier 17.

A second current source 23 is connected to the emitter of the second transistor 20. A resistance 24 is connected between the emitter of the first transistor 13 and the emitter of the second transistor 20. Numerals 25 and 26 indicate load resistances and numerals 27 and 28 indicate output terminals.

Next, operation of the circuit having a configuration shown in FIG. 1 is explained. When a DC level of an output of the sawtooth wave generation circuit 10 is set to Vref, the bias voltage of the bias source 19 is also set to Vref. When the voltage at the input terminal 12 is Vref, the first differential amplifier 11 makes a feedback operation to let the voltage at the input terminal 15 also be Vref.

That is, the DC level of the output of the first differential amplifier 11 varies with the difference between the voltage at input terminal 12 and the voltage at the input terminal 15. When the DC level of the output of the first differential amplifier 11 varies, then the emitter voltage of the first transistor 13 varies, and stabilizes when the difference between the voltage at the input terminal 12 and the voltage at the input terminal 15 becomes zero.

The second differential amplifier 17 also makes a similar operation. Since the bias voltage of the bias source 19 is set to Vref, an input terminal 18 and the other input terminal 22 are kept at Vref always. Consequently, voltages at both ends of the resistance 24 are equal, and no current flows through it.

Figure 7:
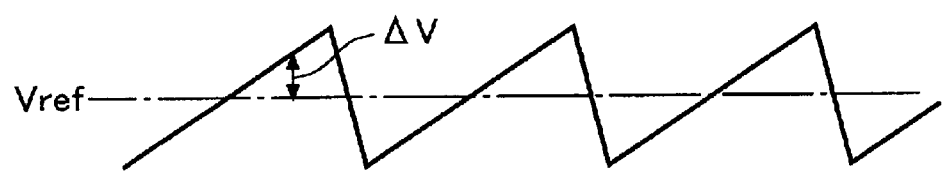
FIG. 7 is a waveform diagram of an input signal according to this invention.

Then the sawtooth wave as indicated by solid lines in FIG. 7 is applied to the input terminal 12. When the level of the sawtooth wave is increased, the output voltage of the first differential amplifier 11 also increases, and a current flow from the collector to the emitter of the first transistor 13 increases.

As a result, a voltage at the output terminal 27 drops. The first current source 16 provides a constant current, and the emitter voltage of the second transistor 20 is fixed at Vref. Assuming the change in the emitter voltage of the first transistor is Δ V, an electric current Δ I, which is Δ V divided by the resistance value R of the resistance 24, flows from a node of the emitter of the first transistor 13 to a node of the emitter of the second transistor 20.

Since the second current source 23 also provides a constant current, a current from the collector to the emitter of the second transistor 20 decreases by Δ I, resulting in increase in a voltage at the output terminal 28. Hence, the levels of the output terminals 27 and 28 vary in response to the change in the level of the input terminal 12.

The output terminal 27 shows the same amount of change in opposite phase as the level of the input terminal 12 varies. That is, a voltage unaffected by a mutual conductance gm of the first transistor 13 is obtained at the emitter of the first transistor 13, by the feedback operation of the first differential amplifier 11.

Figure 8A:
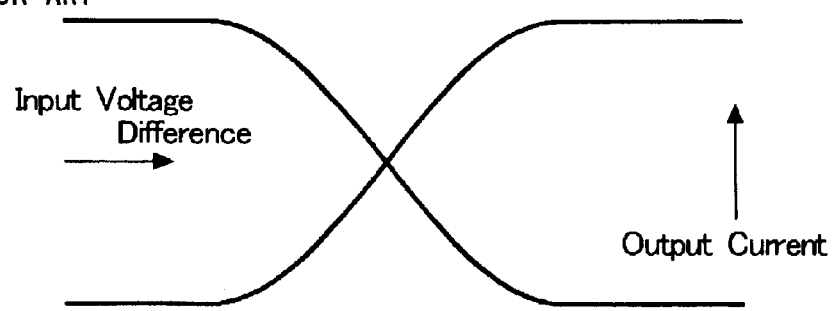
FIG. 8A and FIG. 8B are diagrams showing change in output current in relation to input voltage of differential amplifiers.
Figure 8B:
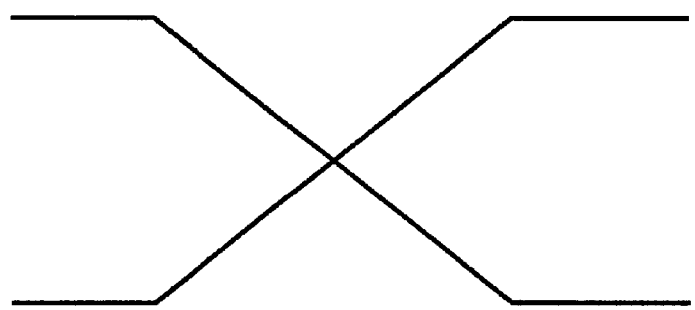

FIG. 8A and FIG. 8B are diagrams showing changes in output currents in relation to input voltages of differential amplifiers. FIG. 8A shows change in the output current taken as the vertical axis with respect to the difference between the two input voltages taken as the horizontal axis, for a commonly used differential amplifier. As seen from FIG. 8A, the change in the output current is rounded off at the beginning of rising from zero as well as at the beginning of falling from the maximum current.

On the contrary, for the differential amplifier shown in FIG. 1, the change in the current from the collector to the emitter of the first transistor 13 and that of the second transistor 20 against the change in the voltage of the input terminal 12 has no rounding off, as seen from FIG. 8B. On this account, the display at the upper edge and lower edge becomes natural, when the limiting waveform obtained at the output terminal 27 or 28 is used.

The maximum value of limiting level in FIG. 1 is defined by the power supply voltage Vcc while the minimum value of that is defined by the product of the load resistance 25 and the current of the first current source 16 or the product of the load resistance 26 and the current of the second current source 23. The first current source 16 and the second current source 23 can be composed of an element which makes a constant current flow, for example a large resistance.

And the limit level is not only precise but also easily changeable, because the limit level can be adjusted by only changing the current values of the first current source 16 and the second current source 23.

A limiter circuit having a good linearity is available according to this invention. Scattering of the electron beam and the distorted display at the upper edge and lower edge of the TV screen do not occur, when the limiter circuit of this invention is applied to a sawtooth wave generator.

What is claimed is:

1. A limiter circuit comprising:
   a first differential amplifier to a first input terminal of which an input signal is applied;
   a first transistor to a base of which an output of the first differential amplifier is applied;
   a first feedback path connected between an emitter of the first transistor and a second input terminal of the first differential amplifier;
   a first current source connected to the emitter of the first transistor;
   a second differential amplifier to a first input terminal of which a bias voltage is applied;
   a second transistor to a base of which an output of the second differential amplifier is applied;
   a second feedback path connected between an emitter of the second transistor and a second input terminal of the second differential amplifier;
   a second current source connected to the emitter of the second transistor; and
   a resistance connected between the emitter of the first transistor and the emitter of the second transistor.

2. The limiter circuit of the claim 1, wherein output signals are provided from a collector of the first transistor and a collector of the second transistor.

3. The limiter circuit of the claim 1, wherein an output signal is provided from a collector of the first transistor or a collector of the second transistor.

4. The limiter circuit of the claim 1, wherein a bias voltage of the first differential amplifier and a bias voltage of the second differential amplifier are made equal.

5. The limiter circuit of the claim 1, wherein a limit level is changed by changing a current value of the first current source and a current value of the second current source.

6. The limiter circuit of the claim 1, wherein the input signal applied to the first terminal of the first differential amplifier is an output signal of a sawtoothwave generation circuit.

7. A limiter circuit comprising:
   a first differential amplifier to a first input terminal of which an input signal is applied;
   a first transistor to a base of which an output of the first differential amplifier is applied;
   a first feedback path connected between an emitter of the first transistor and a second input terminal of the first differential amplifier;
   a first resistance connected to a collector of the first transistor;
   a second differential amplifier to a first input terminal of which a bias voltage is applied;
   a second transistor to a base of which an output of the second differential amplifier is applied;
   a second feedback path connected between an emitter of the second transistor and a second input terminal of the second differential amplifier;
   a second resistance connected to a collector of the second transistor; and
   a third resistance connected between the emitter of the first transistor and the emitter of the second transistor,
   wherein output signals are provided from the collector of the first transistor and the collector of the second transistor.

8. A limiter circuit comprising:
   a first transistor means for providing a first emitter current;
   a first amplifying means for applying an output voltage of which to a base of the first transistor means so that an emitter voltage of the first transistor means and an input signal applied to a first terminal of which are made equal;
   a first current source means for providing the first emitter current of the first transistor means;
   a second transistor means for providing a second emitter current;
   a second amplifying means for applying an output voltage of which to a base of the second transistor means so that an emitter voltage of the second transistor means and a bias voltage applied to a first terminal of which are made equal;
   a second current source means for providing the second emitter current of the second transistor means; and
   a current generation means for generating a current in response to a voltage difference between the emitter of the first transistor means and the emitter of the first transistor means.

* * * * *